March 30, 1965 E. H. BOITEN 3,176,246

CIRCUIT FOR KEEPING THE CENTRAL FREQUENCY OF
A FREQUENCY MODULATED OSCILLATOR CONSTANT

Filed March 29, 1961

INVENTOR.

Egbert H. Boiten

BY

Watson, Cole, Grindle & Watson

ATTORNEYS

United States Patent Office 3,176,246
Patented Mar. 30, 1965

3,176,246

CIRCUIT FOR KEEPING THE CENTRAL FREQUENCY OF A FREQUENCY MODULATED OSCILLATOR CONSTANT

Egbert Hendrik Boiten, Pijnacker, Netherlands, assignor to The Nederlandse Organisatie voor Toegepast-Natuurwetenschappelijk Onderzoek ten behoeve van Nijverheid, Handel en Verkeer, The Hague, Netherlands, a corporation of the Netherlands Filed Mar. 29, 1961, Ser. No. 99,182
1 Claim. (Cl. 332—19)

Figure 1:
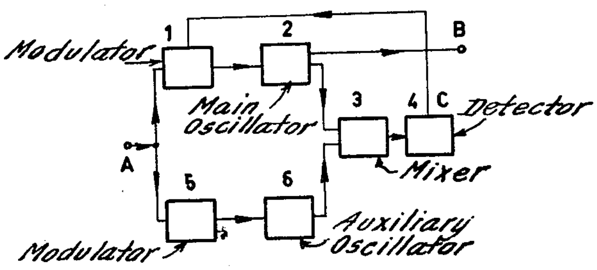

The invention relates to a circuit for keeping constant the central frequency of a first frequency modulated oscillator, in which the oscillation excited together with the oscillation excited by a second oscillator is fed to a mixer connected to a detector from which a control voltage is derived, which is guided to the input circuit of a modulator, which modulates the frequency of the oscillations excited by the first oscillator, to which modulator at the same time is fed a modulating signal, and in which the modulating signal is removed from the said control voltage by modulation of the oscillation of the second oscillator with a signal derived from the modulating signal.

Such a circuit is known per se, for instance from American patent specification No. 2,674,720.

However, the second oscillator, the so-called auxiliary oscillator of this known circuit is modulated in phase, so that the suppression of the modulation after the discriminator is not complete.

The object of the invention is a circuit which more effectively suppresses the modulation after the detector.

For this purpose the invention is characterized in that a second oscillator is used, which can be directly modulated in frequency, and in that the shifts in frequency of an oscillation excited by the first oscillator, also very slow or lasting shifts in consequence of the modulating signal, are equal as to their absolute values to corresponding shifts in the frequency of the oscillation excited by the second oscillation and wherein the first oscillator excites an oscillation having a frequency which is at least ten times as high as that excited by the second oscillator and wherein the detector possesses a stability larger than that of the first oscillator and determines the stability of the circuit.

Through this measure a control signal which is free from modulation will occur at the input of the modulator. This signal is practically proportional to the instability of the main or first oscillator. If care is taken that the detector from which a control voltage is derived, which control voltage is proportional to the undesired frequency shift of the main oscillator and which follows after the mixer, has a great frequency stability, a great snsitivity and a narrow band width, and that the said detector is tuned to the desired frequency of the signal at the output of the mixer, and further care is taken that the frequency $f_2$ of the oscillation excited by the auxiliary or second oscillator maximally amounts to 10% of the frequency $f_1$ of the oscillation excited by the main oscillator, then the stability of said detector determines the stability of the main oscillator, and only the undesired frequency shifts are counteracted by the control voltage. In that case it is no longer necessary to use a very stable crystal oscillator as reference oscillator, because, as will appear hereinafter, the influence of the drift of the auxiliary oscillator on the output signal of the mixer decreases in proportion as $$\frac{f_1}{f_2}$$

is larger.

Preferably, in the circuit according to the invention an astable multivibrator is employed as the second oscillator, because it is easy to frequency modulate such a multivibrator immediately. (See for instance P. A. Neeteson: Junction Transistors in Pulse Circuits; Philips' Technical Library, Eindhoven, 1959, from page 12 on, more particularly pages 17 and 18.)

A circuit delivering a modulated oscillation of high frequency and great stability has already been proposed, in which a relaxation generator of low frequency is immediately frequency-modulated, and the modulated oscillation derived herefrom is mixed with, for instance, a crystal-stabilized, unmodulated oscillation of high frequency. In this known circuit the desired frequency-modulated oscillation must be filtered out of the signal coming from the mixer which contains the mixing frequencies.

However, for this purpose it is necessary for the circuit to contain an expensive wide filter, which must be able to let through the desired oscillation with the modulation. The oscillation obtained after the filtering process has little power, and for practical purposes this will generally have to be amplified. According to the invention, on the contrary, the first oscillator delivering the desired frequency-modulated oscillation can immediately be a high-powered one. As according to the invention the signal coming from the mixer as a modulation only comprises the undesired frequency shifts of the first oscillator, a sharp, inexpensive and narrow filter, which can easily be made of high quality, can be used after the mixer. Therefore, according to the invention, it is preferred to use a crystal discriminator as detector. It has namely been found in an embodiment of the invention that a crystal discriminator having a crystal, which crystal has a fundamental frequency of well over 22 megacycles and which is struck in its third harmonic, i.e. about 67 megacycles, had a linear region of about 600 cycles and a band width of from 3 to 4 kilocycles between its tops.

Therefore, with this crystal discriminator it is in practice very well possible to meet the requirements that are made, for instance when using the device in transmitting measuring results over distances which are not too long.

Figure 2:
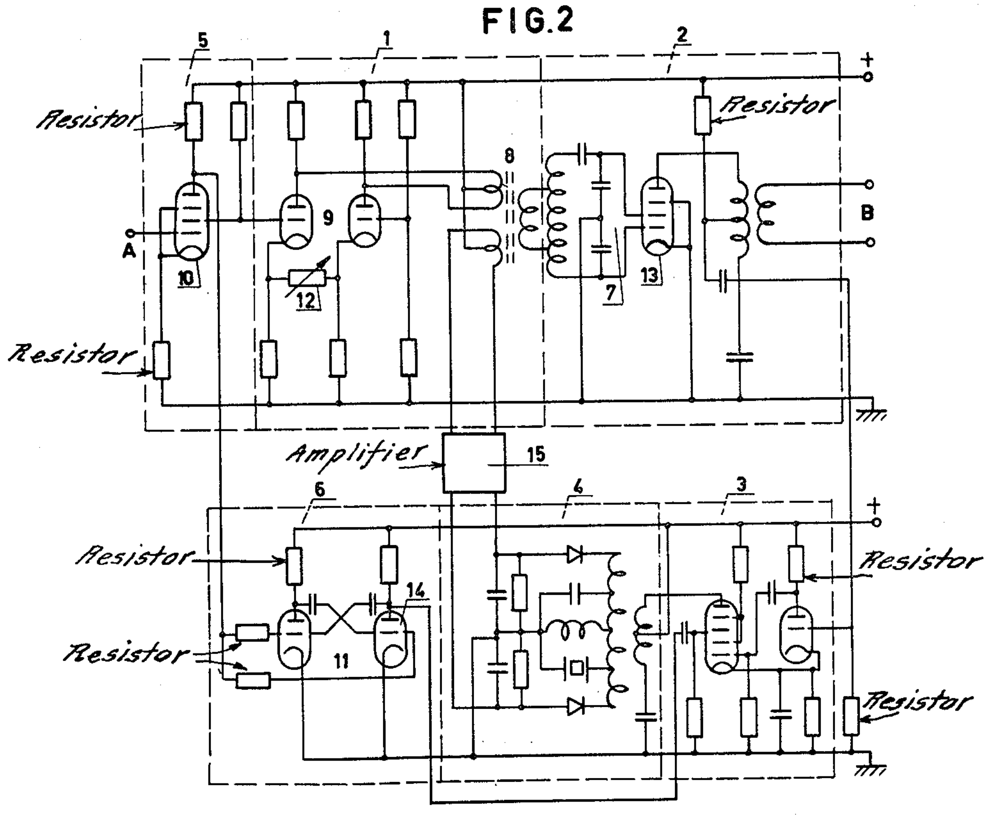

The circuit according to the invention will hereinafter be further illustrated with the aid of a drawing, in which:

FIG. 1 is a block diagram in which the principle of the stabilization circuit is applied, and FIG. 2 is an elaborated example of the circuit according to the invention.

In FIG. 1 the modulating signal is fed to the circuit at A. The oscillations excited by a main oscillator 2 and modulated by the modulator 1 are mixed with the oscillations excited by an auxiliary oscillator 6 and modulated by the modulator 5 in a mixer 3, and subsequently fed to a detector 4.

At the output C of the detector 4 a voltage arises which is proportional to the possibly occurring undesired shift in frequency of the main oscillator 2. This voltage is used to counteract the frequency shift of the main oscillator 2 in the modulator 1. The output signal having the constant central frequency is taken off at B. The operation of this circuit is as follows.

If the frequency of the carrier wave of the oscillations excited by the main oscillator 2 and the carrier wave frequency of the oscillations excited by the auxiliary oscillator 6 in consequence of the modulating signal both undergo frequency shifts the absolute values of which are equal, this will, among other things, give rise to a signal without modulation at the output of the mixer 3, the frequency of said signal being either the difference between or the sum of the two oscillator frequencies, according as the signs of the frequency shifts of the two oscillators are alike or opposite. This signal is modulation-free, no matter what the frequency of the modulating signal is. This signal is fed to a detector having a high stability of frequency, a great sensitivity and a narrow band width and which is tuned to the above-mentioned difference in or sum of frequencies. Now if the frequency $f_1$ of the main oscillator 2 suffers an undesired change, which is not compensated by an equally great change of the auxiliary oscillator 6, a voltage arises at the output of the detector 4, which is proportional to the change of $f_1$ and which is used to diminish the instability of the main oscillator 2.

The instability of the auxiliary oscillator 6 has hardly any influence if only care is taken that the frequency of this oscillator is many times smaller than that of the main oscillator 2. The following example is given by way of illustration:

If it is assumed that the main oscillator 2 having the central frequency $f_1$ of 20 megacycles is modulated by $\Delta f=10^{-4}f_1=2000$ cycles, and that the auxiliary modulator 6 can be modulated up to a value of for instance 10% of its carrier wave frequency $f_2$, then for this carrier wave frequency $f_2=20{,}000$ cycles can be chosen.

If it is further assumed that the frequency stability of the oscillators, i.e.

$$\frac{\text{carrier wave frequency}}{\text{undesired maximal frequency shift}}$$

of the main oscillator 2 is $10^{+4}$, that of the auxiliary oscillator 6 is $10^{+3}$ and the stability of the detector 4 is $10^{+5}$ (by the stability of a detector being understood the proportion between the frequency, for which the detector gives an output voltage of 0, and the maximal undesired shift of this frequency), then it follows from this that the drift of the auxiliary oscillator 6, and the drift of the main oscillator 2 can amount to the absolute values of $10^{-3}\times f_2$ is=20 cycles and $10^{-4}\times f_1$ is=2000 cycles respectively.

From the choice $f_1=20$ megacycles and $f_2=20{,}000$ cycles it follows that $f_1=1000f_2$. Therefore, the relative change in frequency in the signal $f_1-f_2$ or $f_1+f_2$ at the output of the mixer 3 in consequence of the drift of $f_2$ is maximally $10^{-6}+f_1$, which is also 20 cycles. The influence of the instability of the auxiliary oscillator 6 on $f_1-f_2$ or $f_1+f_2$ becomes smaller in proportion as $$\frac{f_1}{f_2}$$

is larger. The instability of the auxiliary oscillator 6 may then be neglected. So the frequency $f_1$ is compared with the tuning frequency of the detector 4 having a stability of $10^{+5}$. By the control of the main oscillator 2 the stability of $f_1$ can in this example be increased to at most 10× (from $10^{+4}$ to $10^{+5}$), whilst the modulation of $f_1$ is not counteracted by the control. The FIG. 2 is a more elaborated embodiment of a circuit in which the auxiliary oscillator 6 is modulated. The elements of the circuit are to be found back under the same numerals as in the block diagram of FIG. 1 and they are represented as right angles surrounded by dotted lines. An LC-oscillator circuit 7 of the Colpitts type having an electronic coupling is employed as main oscillator. The oscillator is modulated by a ferrite modulator 8, which is controlled by a balance amplifier 9. The balance amplifier 9 is controlled by the screen grid signal of the amplifier tube 10. The modulating signal is supplied at A. An astable multivibrator circuit 11 which is modulated by controlling the grid voltages of both tubes by the anode signal of the amplifier tube 10, serves as auxiliary oscillator.

By controlling the amplification of the push pull amplifier stage 9, with the aid of the resistance 12, care is taken that the frequency deviations resulting from the modulating signal in the main oscillator 2 and in the auxiliary oscillator 6 are equal as to absolute value. In the mixer 3, the signals obtained from the anode circuit of tube 13 in the main oscillator 2 and from the anode circuit of tube 14 in the auxiliary oscillator 6 respectively, are mixed. The mixer 3 is followed by a detector 4, which is tuned either to the difference between or the sum of the carrier wave frequencies of the two oscillators. A crystal discriminator which meets the requirements of frequency stability, sensitivity and band width, serves as detector. The output voltage of the detector is fed to an extra control winding of the ferrite modulator 8, whereby an amplifier 15 may be connected in between.

The stabilized output signal is obtained again at B.

I claim:

A circuit comprising a first frequency modulated oscillator, a modulator circuit coupled to said oscillator, a second frequency modulated oscillator, a further modulator circuit coupled to said second oscillator, a common input modulation signal coupled to both said modulator circuits, a mixer with two inputs and an output, one input of which is connected to the output of the first oscillator, the other input of which is connected to the output of the second oscillator, and a crystal discriminator detector tuned to the frequency supplied by said mixer having its input connected to the output of said mixer, the output of said detector being connected to the modulator circuit of only the first oscillator, the operation frequency of said first oscillator being at least ten times as high as the operation frequency of said second oscillator wherein the detector has a stability better than that of the first oscillator to provide a control signal from said detector which is free from modulation.

References Cited by the Examiner

UNITED STATES PATENTS

| | | | |
|---|---|---|---|
| 2,322,588 | 6/43 | Peterson | 332—19 |
| 2,408,858 | 10/46 | Keizer | 329—205 X |
| 2,470,892 | 5/49 | Hepp | 332—19 |
| 2,550,519 | 4/51 | Bataille | 325—423 X |
| 2,577,795 | 12/51 | Mohr | 332—24 X |
| 2,672,589 | 3/54 | McLeod | 332—18 |
| 3,008,095 | 11/61 | Przedpelski | 331—2 X |

OTHER REFERENCES

Hollis: Proceedings of I.R.E., September 1948, vol. 36, No. 9, pp. 1164–1171.

ROY LAKE, *Primary Examiner.*

ALFRED L. BRODY, *Examiner.*